United States Patent
Arena et al.

(10) Patent No.: US 9,324,911 B2
(45) Date of Patent: Apr. 26, 2016

(54) METHODS OF FABRICATING DILUTE NITRIDE SEMICONDUCTOR MATERIALS FOR USE IN PHOTOACTIVE DEVICES AND RELATED STRUCTURES

(71) Applicant: Soitec, Crolles (FR)

(72) Inventors: Chantal Arena, Mesa, AZ (US); Robin Scott, Chandler, AZ (US); Claudio Canizares, Chandler, AZ (US)

(73) Assignee: Soitec, Bernin (FR)

( * ) Notice: Subject to any disclaimer, the term of this patent is extended or adjusted under 35 U.S.C. 154(b) by 174 days.

(21) Appl. No.: 13/720,284

(22) Filed: Dec. 19, 2012

(65) Prior Publication Data

US 2013/0181308 A1  Jul. 18, 2013

Related U.S. Application Data

(60) Provisional application No. 61/580,095, filed on Dec. 23, 2011.

(51) Int. Cl.
*H01L 33/32* (2010.01)
*H01L 21/02* (2006.01)
(Continued)

(52) U.S. Cl.
CPC ............ *H01L 33/32* (2013.01); *H01L 21/0242* (2013.01); *H01L 21/0254* (2013.01); *H01L 21/0262* (2013.01); *H01L 21/02458* (2013.01); *H01L 21/02546* (2013.01); *H01L 21/02664* (2013.01); *H01L 27/153* (2013.01); *H01L 31/03048* (2013.01); *H01L 31/0687* (2013.01); *H01L 31/1848* (2013.01); *H01S 5/32341* (2013.01); *H01S 5/32358* (2013.01); *H01L 33/0062* (2013.01); *H01L 33/08* (2013.01); *Y02E 10/544* (2013.01)

(58) Field of Classification Search
CPC .............. H01L 27/153; H01L 31/3038; H01L 31/1848; H01L 21/0254; H01L 33/32; H01L 33/0062; H01L 33/08; H01L 21/242; H01L 21/02458
USPC .......... 438/93, 48, 54, 69; 257/431, 102, 103, 257/96, 14
See application file for complete search history.

(56) References Cited

U.S. PATENT DOCUMENTS 5,689,123 A    11/1997   Major et al.
6,697,404 B1 *  2/2004   Sato ...................... B82Y 20/00
                                                372/45.01
(Continued)

OTHER PUBLICATIONS

Chalker et al., The Microstructural Influence of Nitrogen Incorporation in Dilute Nitride Semiconductors, Journal of Physics: Condensed Matter 16 (2004) S3161-83170.
(Continued)

*Primary Examiner* — Thinh T Nguyen
(74) *Attorney, Agent, or Firm* — TraskBritt

(57) ABSTRACT

Dilute nitride III-V semiconductor materials may be formed by substituting As atoms for some N atoms within a previously formed nitride material to transform at least a portion of the previously formed nitride material into a dilute nitride III-V semiconductor material that includes arsenic. Such methods may be employed in the fabrication of photoactive devices, such as photovoltaic cells and photoemitters. The methods may be carried out within a deposition chamber, such as a metalorganic chemical vapor deposition (MOCVD) or a hydride vapor phase epitaxy (HVPE) chamber.

29 Claims, 4 Drawing Sheets

(51) Int. Cl.
- H01L 31/0687 (2012.01)
- H01L 27/15 (2006.01)
- H01L 31/0304 (2006.01)
- H01L 31/18 (2006.01)
- H01S 5/323 (2006.01)
- H01L 33/00 (2010.01)
- H01L 33/08 (2010.01)

(56) References Cited

U.S. PATENT DOCUMENTS

| | | | |
|---|---|---|---|
| 6,861,679 B2 | 3/2005 | Otsuka et al. | |
| 6,881,981 B2* | 4/2005 | Tsuda et al. | 257/88 |
| 7,012,283 B2* | 3/2006 | Tsuda | B82Y 20/00 257/102 |
| 2004/0026710 A1* | 2/2004 | Tsuda et al. | 257/103 |
| 2005/0112281 A1* | 5/2005 | Bhat | C30B 29/40 427/248.1 |
| 2006/0057824 A1 | 3/2006 | Araki et al. | |
| 2006/0281202 A1* | 12/2006 | Ishida et al. | 438/21 |
| 2009/0223442 A1 | 9/2009 | Arena et al. | |
| 2010/0052016 A1 | 3/2010 | Hooper et al. | |
| 2010/0148202 A1* | 6/2010 | Tomoda | 257/98 |
| 2013/0164874 A1 | 6/2013 | Arena et al. | |

OTHER PUBLICATIONS

Dimroth et al., Comparison of Dilute Nitride Growth on a Single- and 8x4-inch Multiwafer MOVPE System for Solar Cell Applications, Journal of Crystal Growth, vol. 272 (2004) pp. 726-731.

Du et al, Growth of GaNxAs1-x Atomic Monolayers and their insertion in the Vicinity of GaInAs Quantum Wells, IEE Proc.-Optoelectron, vol. 151, No. 5, Oct. 2004, pp. 254-258.

Jackrel et al., Dilute Nitride GaInNAs and GaInNAsSb Solar Cells by Molecular Beam Epitaxy, Journal of Applied Physics, vol. 101 (2007) pp. 114916-1-114916-8.

Kaul et al., Surface Chemistry of New As Precursors for MOVPE and MOMBE: Phenylarsine and Tertiarybutylarsine on GaAs(100), Journal of Cyrstal Growth, vol. 123 (1992), pp. 411-422.

Kurtz et al., Understanding the Potential and Limitations of Dilute Nitride Alloys for Solar Cells, NREL National Renewable Energy Laboratory, Conference Paper NREL/CP-250-38998, Nov. 2005, 5 pages.

Larsen et al., GaAs Growth Using Tertiarybutylarsine and Trimethylgallium, Journal of Crystal Growth, vol. 93 (1998) pp. 15-19.

Mintairov et al., Atomic Arrangement and Emission Properties of GaAs(In, Sb) N Quantum Wells, Semiconductor Science and Technology, vol. 24 (2009) 075013, 8 pages.

Roman, Jose Maria, State-of-the-Art of III-V Solar Cell Fabrication Technologies, Device Designs and Applications, Advanced photovoltaic Cell Design, Apr. 27, 2004, 8 pages.

International Search Report for International Application No. PCT/IB2012/002396 dated Mar. 18, 2013, 3 pages.

International Written Opinion for International Application No. PCT/IB2012/002396 dated Mar. 18, 2013, 8 pages.

Friedman et al., 1-eV Solar Cells with GaInNAs Active Layer, Journal of Crystal Growth, vol. 195, (1998) pp. 409-415.

Sakai et al., Green Light Emission From GaInNAs/GaN Multiple Quantum Well, Japanese Journal of Applied Physics, Japan Society of Applied Physics, vol. 37, No. 12B, Part 2, Dec. 15, 1998, p. L1508.

International Search Report, for International Application No. PCT/IB2012/002355, dated Mar. 21, 2013, 3 pages.

Kurtz et al., "InGaAsN Solar Cells With 1.0 eV Band Gap, Lattice Matched to GaAs", Applied Physics Letters, AIP, American Institute of Physics, Feb. 1, 1999, pp. 729-731, vol. 74, No. 5, Melville, NY, US.

Sormunen et al., "GaN/GaAs (100) Supperlatices Grown by Metalorganic Vapor Phase Epitaxy Using Dimethylhydrazine Precursor", Journal of Crystal Growth, Oct. 1, 2004, pp. 346-350, Elsevier, Amsterdam, NL.

Wu et al, "Strain-Compensated GaAsN/InGaAs Superlattice Structure Solar Cells", Japanese Journal of Applied Physics, Part 2 (Letters) Japan Soc. Appl. Phys., Jul. 2006, pp. L647-L649, Japan.

Chinese Office Action and Search Report for Chinese Application No. 201280062898.4 dated Feb. 6, 2016, 12 pages.

* cited by examiner

METHODS OF FABRICATING DILUTE NITRIDE SEMICONDUCTOR MATERIALS FOR USE IN PHOTOACTIVE DEVICES AND RELATED STRUCTURES

CROSS-REFERENCE TO RELATED APPLICATIONS

This application claims the benefit of U.S. Provisional Patent Application Ser. No. 61/580,095, filed Dec. 23, 2011, the disclosure of which is hereby incorporated herein in its entirety by this reference. The subject matter of this application is related to the subject matter of U.S. Provisional Patent Application Ser. No. 61/580,085 filed Dec. 23, 2011, in the name of Arena et al. and entitled "Methods of Forming Dilute Nitride Materials for use in Photoactive Devices and Related Structures," the disclosure of which is hereby incorporated herein in its entirety by this reference.

FIELD

Embodiments of the disclosure generally relate to methods of fabricating dilute nitride III-V semiconductor materials for use in photoactive devices, to methods of fabricating photoactive devices including dilute nitride III-V semiconductor materials, and to photoactive devices formed by such methods.

BACKGROUND

Photoactive devices are semiconductor devices that employ semiconductor material to convert electromagnetic radiation into electrical energy or to convert electrical energy into electromagnetic radiation. Photoactive devices include, for example, photovoltaic cells, light-emitting diodes, and laser diodes.

Photovoltaic cells (also referred to in the art as "solar cells" or "photoelectric cells") are used to convert energy from light (e.g., sunlight) into electricity. Photovoltaic cells generally include one or more pn junctions, and can be manufactured using conventional semiconductor materials, such as silicon, as well as III-V semiconductor materials. Photons from impinging electromagnetic radiation (e.g., light) are absorbed by the semiconductor material proximate the pn junction, resulting in the generation of electron-hole pairs. The electrons and holes generated by the impinging radiation are driven in opposite directions by a built-in electric field across the pn junction, resulting in a voltage between the n region and the p region on opposing sides of the pn junction. This voltage may be used to produce electricity. Defects in the crystal lattices of the semiconductor materials at the pn junctions provide locations at which electrons and holes previously generated by absorption of radiation can recombine, thereby reducing the efficiency by which the radiation is converted into electricity by the photovoltaic cells.

The photons of the electromagnetic radiation that impinge on a photovoltaic cell must have sufficient energy to overcome the bandgap energy of the semiconductor material to generate an electron-hole pair. Thus, the efficiency of the photovoltaic cell is dependent upon the percentage of the impinging photons that have an energy corresponding to the bandgap energy of the semiconductor material. Stated another way, the efficiency of the photovoltaic cell is at least partially dependent upon the relationship between the wavelength or wavelengths of the radiation impinging on the photovoltaic cell and the bandgap energy of the semiconductor material. Sunlight is emitted over a range of wavelengths. As a result, photovoltaic cells have been developed that include more than one pn junction, wherein each pn junction comprises semiconductor material having a different bandgap energy so as to capture light at different wavelengths and increase the efficiencies of the photovoltaic cells. Such photovoltaic cells are referred to as "multi-junction" or "MJ" photovoltaic cells.

Thus, the efficiency of a multi junction photovoltaic cell may be increased by selecting the semiconductor materials at the pn junctions to have band-gap energies that are aligned with the wavelengths of light corresponding to the wavelengths of highest intensity in the light to be absorbed by the photovoltaic cells, and by decreasing the concentration of defects in the crystal lattices of the semiconductor materials at the pn junctions. One way to decrease the concentration of defects in the crystal lattices of the semiconductor materials is to employ semiconductor materials that have lattice constants and coefficients of thermal expansion that are closely matched with one another.

It has been proposed to employ the dilute nitride III-V semiconductor material $Ga_{1-y}In_yN_xAs_{1-x}$, wherein y is about 0.08 and x is about 0.028, in one pn junction of a multi junction photovoltaic cell. Such a dilute nitride III-V semiconductor material may exhibit a bandgap energy of from about 1.0 eV to about 1.1 eV.

Such dilute nitride III-V semiconductor materials have proven difficult to fabricate, at least on a commercial scale. These difficulties are partly due to the disparities in the atomic radii of the various elements of the material, which range from about 0.75 Angstroms to about 1.62 Angstroms. Examples of methods that have been used to fabricate GaIn-NAs are disclosed in, for example, Dimroth et al., *Comparison of Dilute Nitride Growth on a Single-and 8×4-inch Multiwafer MOVPE System for Solar Cell Applications*, JOURNAL OF CRYSTAL GROWTH 272 (2004) 726-731, and in Chalker et al., *The Microstructural Influence of Nitrogen Incorporation in Dilute Nitride Semiconductors*, JOURNAL OF PHYSICS: CONDENSED MATTER 16 (2004) S3161-S3170, each of which is incorporated herein in its entirety by this reference.

BRIEF SUMMARY

This summary is provided to introduce a selection of concepts in a simplified form, such concepts being further described in the detailed description below of some example embodiments. This summary is not intended to identify key features or essential features of the claimed subject matter, nor is it intended to be used to limit the scope of the claimed subject matter.

The present disclosure includes methods of fabricating dilute nitride III-V semiconductor materials, and methods of fabricating photoactive devices including dilute nitride III-V semiconductor materials. A nitride material such as GaInN may be formed or otherwise provided on a substrate within a chamber, and As atoms may be substituted for some N atoms within the GaInN or other nitride material to transform at least a portion of the GaInN or other nitride material into GaInNAs or another dilute nitride III-V semiconductor material. In accordance with some embodiments, the GaInN or other nitride material may comprise a layer of GaInN or other nitride material, which may be grown in the same chamber. The GaInN or other nitride material may be heated in the chamber to an elevated temperature (e.g., about 500° C. or more), and at least one gas or vapor comprising As atoms may be introduced into the chamber to convert at least a portion of the GaInN or other nitride layer to into GaInNAs or another dilute nitride III-V semiconductor material.

Additional embodiments of the disclosure include photoactive devices, such as photovoltaic cells, light-emitting diodes, and laser diodes, which are fabricated in accordance with methods as disclosed herein.

BRIEF DESCRIPTION OF THE DRAWINGS

The present disclosure may be understood more fully by reference to the following detailed description of example embodiments, which are illustrated in the accompanying figures in which.

DETAILED DESCRIPTION

The illustrations presented herein are not meant to be actual views of any particular photoactive device or deposition system, but are merely idealized representations that are employed to describe embodiments of the present disclosure.

As used herein, the term "III-V semiconductor material" means and includes any semiconductor material that is at least predominantly comprised of one or more elements from group IIIA of the periodic table (B, Al, Ga, In, and Ti) and one or more elements from group VA of the periodic table (N, P, As, Sb, and Bi). For example, III-V semiconductor materials include, but are not limited to, GaN, GaP, GaAs, InN, InP, InAs, AlN, AlP, AlAs, InGaN, InGaP, GaInN, InGaNP, GaInNAs, etc.

Figure 1:
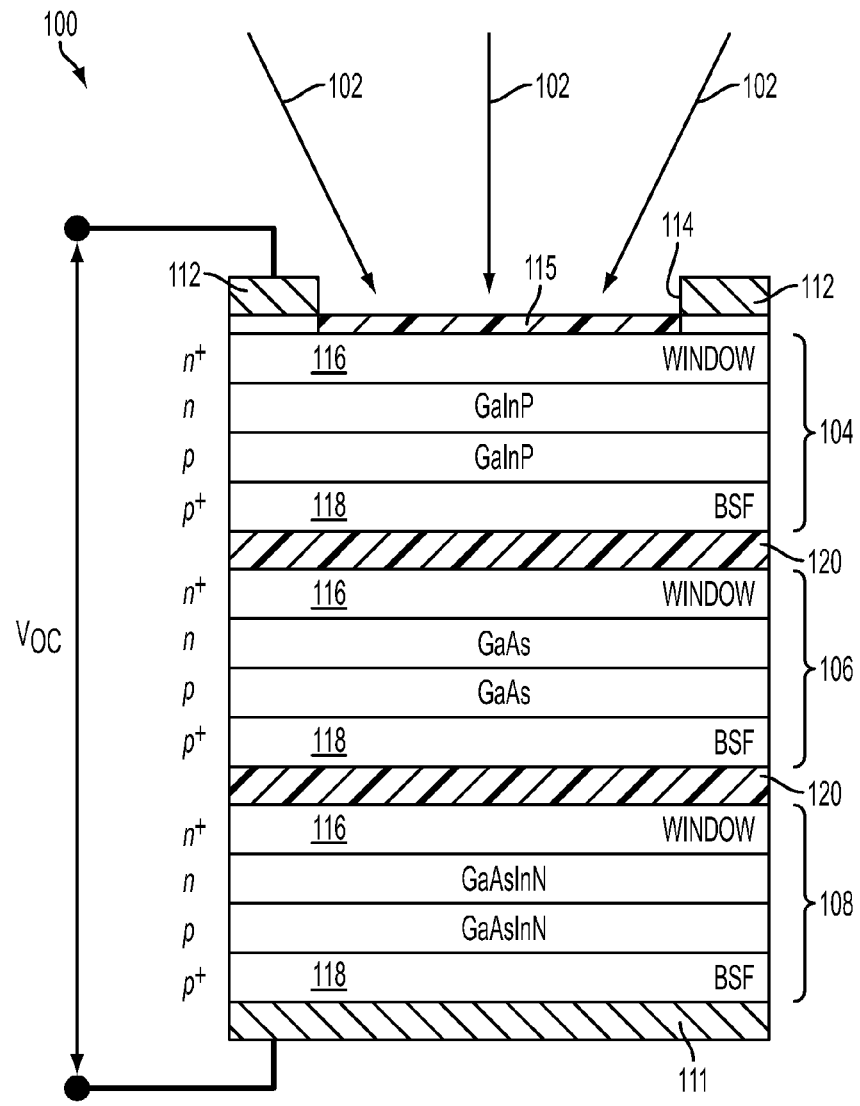
FIG. 1 is simplified schematic diagram illustrating a partial cross-sectional view of a triple junction photovoltaic cell that includes a dilute nitride III-V semiconductor material, which may be fabricated in accordance with embodiments of methods of the disclosure.

FIG. 1 illustrates a photoactive device that may be fondled using embodiments of methods of the present disclosure. The photoactive device of FIG. 1 comprises a photovoltaic cell 100 (e.g., a solar cell). The photovoltaic cell 100 is configured to convert electromagnetic radiation 102 (e.g., light) that impinges on the photovoltaic cell 100 into electricity. The photovoltaic cell 100 of FIG. 1 is a multi junction photovoltaic cell 100, which includes a first subcell 104, a second subcell 106, and a third subcell 108. Each of the subcells 104, 106, 108 includes a multi-layer stack of semiconductor materials. At least one of the subcells 104, 106, 108 comprises a dilute nitride III-V semiconductor material.

Each multi-layer stack of semiconductor materials in the subcells 104, 106, 108 includes a pn junction. In other words, each multi-layer stack of semiconductor materials includes a layer of p type material and an adjacent layer of n type semiconductor material, such that a pn junction is defined at the interface between the adjacent p type and n type semiconductor materials. As known to those of ordinary skill in the art, a charge depletion region (also referred to in the art as a space charge layer) and an internal electric field is developed at the pn junction. As photons of the electromagnetic radiation 102 enter the photovoltaic cell 100, they may be absorbed within the semiconductor materials in the multi-layer stacks of semiconductor material in the subcells 104, 106, 108.

When a photon has an energy corresponding to the bandgap energy of the respective semiconductor material in which the photon is absorbed, an electron-hole pair may be generated within the semiconductor material. When photons are absorbed in the charge depletion regions at the pn junctions and result in the formation of electron hole pairs therein, the internal electric field at the pn junction drives the electron toward the n type region and the hole in opposite direction toward the p type region, which results in a voltage across the pn junction. The voltages of the subcells 104, 106, 108 are accumulated (e.g., in series) across the entire photovoltaic cell 100 to provide an open circuit voltage $V_{OC}$ between a first contact layer 111 on one side of the photovoltaic cell 100 and a second contact layer 112 on an opposing side of the photovoltaic cell 100. The first contact layer 111 and the second contact layer 112 may comprise conductive metals or metal alloys. The second contact layer 112 may be discontinuous so as to provide at least one aperture 114 through the second contact layer 112 through which the electromagnetic radiation 102 may pass and enter the subcells 104, 106, 108. An antireflective (AR) coating 115 may be provided on the photovoltaic cell 100 in the aperture 114, as shown in FIG. 1.

Each of the subcells 104, 106, 108 may be configured to absorb electromagnetic radiation 102 primarily at different wavelengths by employing semiconductor materials at the pn junction that have different compositions and bandgap energies. By way of example and not limitation, the first subcell 104 may comprise a pn junction formed in InGaP III-V semiconductor material having a bandgap energy of approximately 1.88 eV, the second subcell 106 may comprise a pn junction formed in GaAs III-V semiconductor material having a bandgap energy of approximately 1.42 eV, and the third subcell 108 may comprise a pn junction formed in GaInNAs III-V semiconductor material having a bandgap energy of approximately 1.00 eV.

At least one of the subcells 104, 106, 108 comprises a dilute nitride III-V semiconductor material, which, in the embodiment of FIG. 1, is the GaInNAs dilute nitride III-V semiconductor material in the third subcell 108. The GaInNAs may comprise $Ga_{1-y}In_yN_xAs_{1-x}$, wherein y is greater than 0.0 and less than 1.0 (e.g., between about 0.08 and about 1.0), and x is between about 0.1 and about 0.5. Other dilute nitride materials, such as GaInNAsSb may be employed in additional embodiments of the disclosure.

With continued reference to FIG. 1, each of the subcells 104, 106, 108 may include additional layers of material, which may include, for example, window layers 116 and back surface field (BSF) layers 118. The window layers 116 and BSF layers 118 are used to transition the material composition across the photovoltaic cell 100 in a manner that mitigates defects and, hence, promotes current flow without electron-hole recombination, and that allows the electromagnetic radiation 102 to propagate through the photovoltaic cell 100 to the various subcells 104, 106, 108.

As shown in FIG. 1, tunnel junction layers 120 may be disposed between the subcells 104, 106, 108. The tunnel junction layers 120 are used to provide an interconnection between the opposing n and p type regions of the subcells 104, 106, 108 adjacent the tunnel junction layers 120 on opposing sides thereof that have a low electrical resistance. The tunnel junction layers 120 may be at least substantially transparent to the electromagnetic radiation 102 to allow the electromagnetic radiation 102 to penetrate through the tunnel junction layers 120 to underlying subcells 104, 106, 108. Each tunnel junction layer 120 may comprise a highly doped n type layer and a highly doped p type layer (not shown). The semiconductor material or materials of the highly doped n and p type layers may have a wide bandgap. In this configuration, the depletion region may be relatively narrow, and tunneling of electrons from the conduction band in the n type region to the valence band in the p type region is facilitated. Thus, the tunnel junction layers 120 may comprise a plurality of layers of semiconductor material (e.g., III-V semiconductor material).

Figure 2:
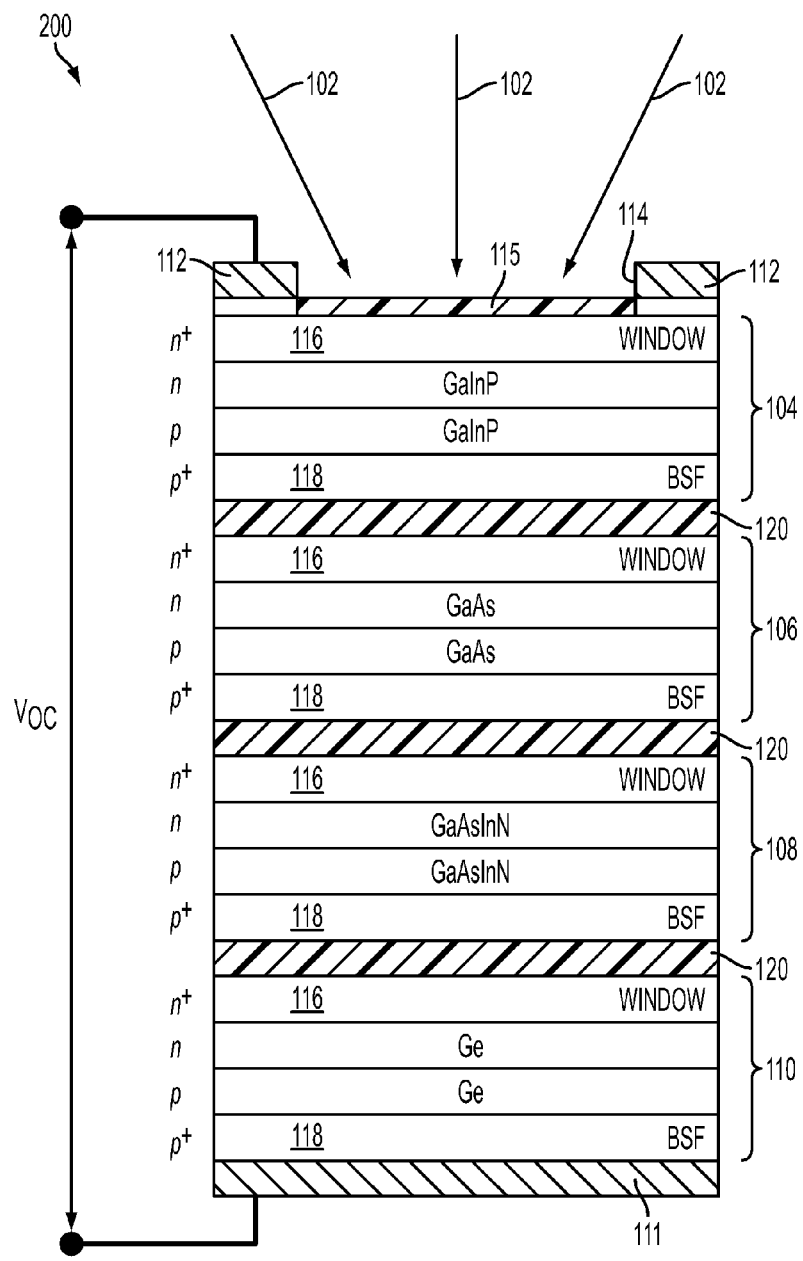
FIG. 2 is a simplified schematic diagram illustrating a partial cross-sectional view of a quadruple junction photovoltaic cell that includes a dilute nitride III-V semiconductor material, which may be fabricated in accordance with embodiments of methods of the disclosure.

Photovoltaic cells having less or more subcells (e.g., one, two, four, five, etc.) also may be fabricated in accordance with embodiments of the present disclosure. For example, FIG. 2 illustrates another photovoltaic cell 200 that is generally similar to the photovoltaic cell 100 of FIG. 1. The photovoltaic cell 200, however, further includes a fourth subcell 110. By way of example and not limitation, the fourth subcell 110 may comprise a pn junction formed in Ge semiconductor material having a bandgap energy of approximately 0.66 eV. By including the additional fourth subcell 110, the efficiency of the photovoltaic cell 200 of FIG. 2 may be higher than that of the photovoltaic cell 100 of FIG. 1.

In addition to the optical and electrical properties that are to be exhibited by the various layers of material in the photovoltaic cells 100, 200, the various III-V semiconductor materials therein are crystalline (and often consist essentially of a single crystal of the material) and may be subject to physical constraints and considerations. The presence of defects in the crystalline structure of the various III-V semiconductor materials can provide locations at which electrons and holes collect and recombine, thereby reducing the efficiency of the photovoltaic cells 100, 200. As a result, it is desirable to form the various III-V semiconductor materials to have relatively low defect concentrations therein. To reduce the concentration of defects at the interfaces between the various III-V semiconductor materials, the compositions of the various layers may be selected such that adjacent layers of material have generally matching lattice constants and thermal expansion coefficients. These additional design parameters provide further restrictions on the materials that may be successfully employed in the various III-V semiconductor materials within the photovoltaic cells 100, 200.

Photovoltaic devices that include dilute nitride III-V semiconductor material, such as the photovoltaic cell 100 of FIG. 1 and the photovoltaic cell 200 of FIG. 2, which comprise the dilute nitride III-V semiconductor material GaInNAs in the third subcell 108, have proven difficult to fabricate in high volumes and with high yield. The concentration of nitrogen in GaInNAs that results in the GaInNAs exhibiting a bandgap energy of about 1.00 eV is about two atomic percent (2 at %). The elements in GaInNAs have varying atomic radii, as shown in Table 1 below.

TABLE 1

| ELEMENT | ATOMIC RADIUS (Å) |
| --- | --- |
| Ga | 1.22 |
| In | 1.62 |
| As | 1.21 |
| N | 0.75 |

Due, at least in part, to the disparate atomic radii of these elements, there is a tendency for a GaAsN phase to separate out from the GaInNAs as the nitrogen content in the GaInNAs increases. Although addition of more indium (which has a relatively large atomic radius) may mitigate this effect to some extent, defect-related recombination centers continue to plague currently available GaInNAs and other dilute nitride III-V semiconductor materials.

In accordance with embodiments of the present disclosure, GaInNAs and other dilute nitride III-V semiconductor materials may be formed for use in photoactive devices, such as the photovoltaic cell 100 of FIG. 1 and the photovoltaic cell 200 of FIG. 2, light-emitting diodes, lasers, and other photoactive devices, by first forming a nitride material that is at least substantially free of arsenic (As), and subsequently substituting arsenic atoms for some N atoms within the nitride material to transform at least a portion of the nitride material into a dilute nitride III-V semiconductor material that includes arsenic. These methods may be carried out in some embodiments within a metalorganic chemical vapor deposition (MOCVD) or a hydride vapor phase epitaxy (HVPE) deposition chamber, which may first be employed to form the nitride material in an MOCVD or HVPE process, and to subsequently incorporate arsenic into the nitride material by substituting arsenic for nitrogen in the nitride material.

By way of example and not limitation, GaInNAs may be fabricated by forming GaInN on a substrate within a chamber, and substituting As atoms for some N atoms within the GaInN to transform at least a portion of the GaInN into GaInNAs. The As atoms may be substituted for some N atoms within the GaInN by heating the GaInN in a chamber in the presence of an arsenic-containing gas or vapor such as arsine or a metalorganic arsine precursor vapor. Such a method is described in further detail below with reference to FIGS. 3 through 5.

Figure 3:
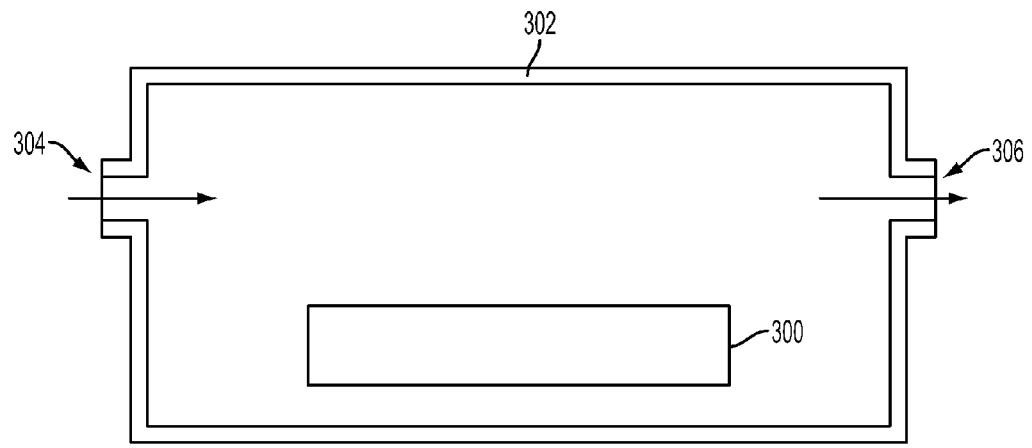
FIGS. 3 through 5 are simplified schematic diagrams illustrating the fabrication of a dilute nitride III-V semiconductor material within a deposition chamber in accordance with embodiments of methods of the disclosure.

Referring to FIG. 3, a substrate 300 may be positioned within a deposition chamber 302. The deposition chamber 302 may comprise an MOCVD or an HVPE deposition chamber. The deposition chamber 302 may comprise one or more inlets 304 through which one or more gases and/or vapors may be introduced into the deposition chamber 302 during a deposition process, and one or more outlets 306 through which gases and/or vapors may be vented out from the deposition chamber 302 during a deposition process.

The substrate 300 may comprise one or more previously formed layers of material. In some embodiments, the substrate 300 may comprise an at least partially formed photoactive device. For example, in some embodiments, the substrate 300 may comprise the portion of the photovoltaic cell 100 of FIG. 1 shown below the GaInNAs layers of the third subcell 108 or the portion of the photovoltaic cell 200 of FIG. 2 shown below the GaInNAs layers of the third subcell 108. In some embodiments, the substrate 300 may comprise a buffer layer exposed at the upper major surface of the substrate 300, which may have a lattice parameter close to that of the GaInN or other nitride layer to be formed thereon. For example, if it is desired to epitaxially grow GaInN on the substrate 300, the substrate 300 may include a GaN buffer layer thereon that is exposed at the upper major surface of the substrate 300. The GaInN then may be epitaxially grown directly on the exposed upper surface of the GaN buffer layer. In some embodiments, a base of the substrate 300 may comprise, for example, a sapphire ($Al_2O_3$) substrate.

Figure 4:
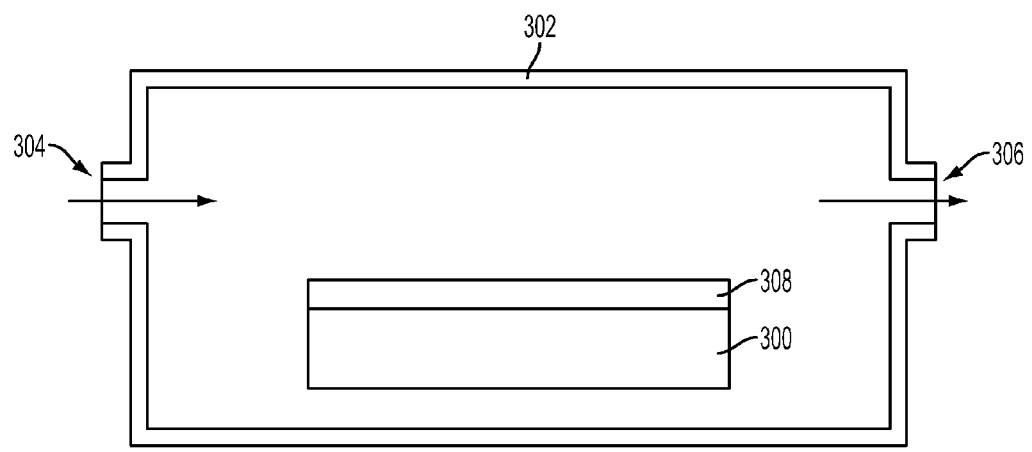

Referring to FIG. 4, a layer 308 of GaInN may be deposited (e.g., epitaxially grown) on the substrate 300 within the deposition chamber 302 using an MOCVD or an HVPE process. By way of example and not limitation, HVPE processes that may be used to epitaxially deposit the layer 308 of GaInN on the substrate 300 are described in U.S. Patent Application Publication No. US 2009/0223442 A1, which published Sep. 10, 2009 in the name of Arena et al., the disclosure of which is incorporated herein in its entirety by this reference.

Figure 5:
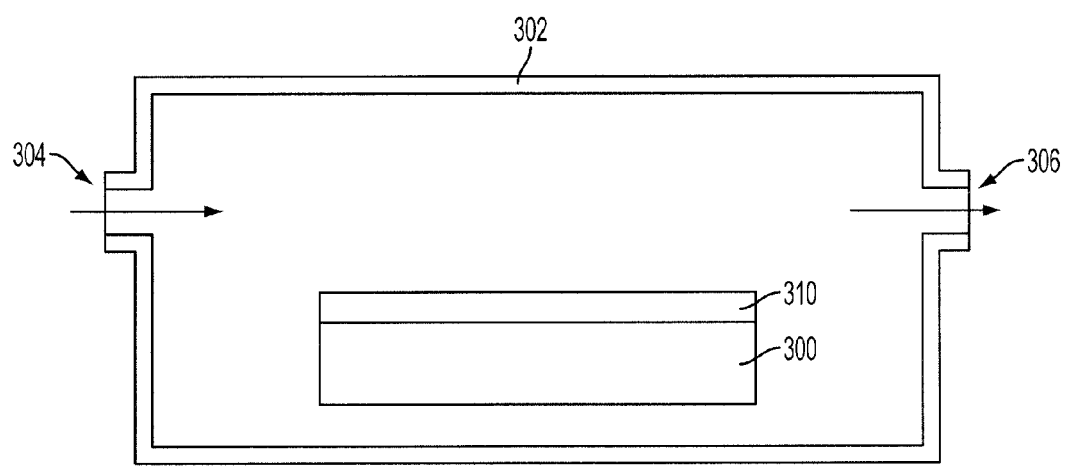

Referring to FIG. 5, after forming the layer 308 of GaInN on the substrate 300, a gas or vapor that includes arsenic may be introduced into the deposition chamber 302 and used to substitute As atoms for some N atoms within the layer 308 of GaInN to transform at least a portion of the layer 308 of GaInN into GaInNAs material 310.

The gas or vapor that includes arsenic may comprise, for example, $AsR_3$, wherein each R is individually selected from the group consisting of hydrogen, alkyl, aryl, and vinyl groups. In some embodiments, each R may be individually selected from the group consisting of hydrogen and tertiary-butyl groups. As non-limiting examples, the gas or vapor that includes arsenic may be arsine ($AsH_3$), tertiarybutylarsine ($AsH_2C(CH_3)_3$) (TBAs), or a mixture of arsine and TBAs. As discussed in further detail below, TBAs is a metalorganic arsine precursor which may be decomposed to form arsine. Other metalorganic arsine precursors also may be employed as the arsenic-containing gas or vapor.

The layer 308 of GaInN (FIG. 4) may be heated in the deposition chamber 302 to a temperature at which the GaInN is slightly unstable while the gas or vapor that includes arsenic is caused to flow through the deposition chamber 302 over the GaInN. For example, GaInN is slightly unstable at temperatures above about 600° C. At these temperatures, nitrogen atoms may be released from the GaInN. As the nitrogen atoms are released from the GaInN, arsenic atoms may be substituted into the GaInN from the arsenic-containing gas or vapor within the deposition chamber 302 to form the GaInNAs material 310. The temperature within the deposition chamber 302 also may be sufficiently high to cause at least some of the gas or vapor that includes arsenic to decompose so as to result in the formation of discrete As atoms (e.g., As ions) within the deposition chamber 302. Arsine may be about fifty percent (50%) pyrolized at about 600° C. TBAs may be about twenty-five percent (25%) decomposed at temperatures less than about 500° C., and may be substantially fully decomposed at about 610° C. Thus, in accordance with some embodiments, the layer 308 of GaInN (FIG. 4) may be heated in the deposition chamber 302 in the presence of an arsenic-containing gas or vapor such as arsine and/or a metalorganic arsine precursor vapor (e.g., TBAs) to at least about 500° C., and, more particularly, to at least about 600° C.

In some embodiments, ammonia may be introduced into the deposition chamber 302 at the same time the gas or vapor that includes arsenic is introduced into the deposition chamber 302, which may stabilize the surface of the InGaN while As atoms are substituted for some N atoms within the layer 308 of GaInN to transform at least a portion of the layer 308 of GaInN into GaInNAs material 310.

Additional gases or vapors optionally may be introduced into the deposition chamber 302 to assist the decomposition of the arsine-containing gas or vapor as needed or desirable. For example, hydrogen gas may be introduced into the deposition chamber 302 to assist with the decomposition. Arsine decomposes in the presence of hydrogen gas according to the reaction represented in Equation 1 below.

$$2AsH_3 + H_2 \rightarrow 4H_2 + 2As \qquad \text{Eq. 1:}$$

Decomposition of TBAs can occur via two routes. In a first route, intra-molecular coupling between TBAs molecules can result in decomposition according to the reaction represented in Equation 2 below.

$$TBAs \rightarrow C_4H_{10} + AsH \qquad \text{Eq. 2:}$$

The intra-molecular coupling is believed to proceed by bonding of the tertiarybutyl group with one of the H atoms attached to the As atom to form the $C_4H_{10}$. The AsH produced by the reaction of Equation 2 will not decompose until the temperature within the deposition chamber 302 is sufficiently high to result in decomposition of arsine ($AsH_3$) as well.

In a second route, TBAs may decompose through β-elimination at relatively higher temperatures according to the reaction represented in Equation 3 below.

$$TBAs \rightarrow C_4H_8 + AsH_3 \qquad \text{Eq. 3:}$$

Thus, in accordance with some embodiments of the present disclosure, TBAs may be decomposed in the deposition chamber 302 to form at least one of AsH and $AsH_3$. The at least one of AsH and $AsH_3$ also may decompose within the deposition chamber 302 to form As atoms, which may be incorporated into the layer 308 of GaInN to result in formation of the GaInNAs material 310. As the As atoms are incorporated into the layer 308 of GaInN, they may occupy sites in the crystal lattice of the material previously occupied by nitrogen atoms that have been desorbed from the layer 308 of GaInN.

In some embodiments, the thickness of the previously formed layer 308 of GaInN may be selectively limited such that As may be substituted throughout the layer 308 of GaInN to form a generally homogeneous layer of GaInNAs material 310. To attain thicker layers of GaInNAs material 310, the actions of forming the layer 308 of GaInN and subsequently substituting arsenic into the layer 308 of GaInN to form the GaInNAs material 310 as previously described may be repeated one or more times to attain a layer of GaInNAs material 10 of desirable total thickness.

During the substitution of arsenic atoms for nitrogen atoms within the layer 308 of GaInN to form the GaInNAs material 310 as described above, the temperature and pressure within the deposition chamber 302, as well as the flow rates and partial pressures of the gases and/or vapors (e.g., arsenic-containing gas or vapor, hydrogen gas, nitrogen carrier gas, etc.) flowing through the deposition chamber 302 may be adjusted in a manner that results in general equilibrium of the desorption of nitrogen and incorporation of arsenic and, hence, conversion of the layer 308 of GaInN into the GaInNAs material 310. The various parameters that achieve such general equilibrium may vary depending on, for example, the composition of the arsenic-containing gas or vapor, and the desired composition of the GaInNAs material 310 to be formed.

In some embodiments, the GaInNAs material 310 may be formed to comprise $Ga_{1-y}In_yN_xAs_{1-x}$, wherein y is greater than 0.0 and less than 1.0, and x is between about 0.1 and about 0.5. Additionally, the GaInNAs material 310 may be formed to have a composition such that the GaInNAs material 310 exhibits a bandgap energy of between about 0.9 eV and about 1.2 eV.

After forming the GaInNAs material 310 or other dilute nitride III-V semiconductor material as described above, the resulting structure may be further processed to form a photoactive device, such as one of the multi junction photovoltaic cells 100, 200 of FIGS. 1 and 2, a light-emitting diode, or a laser diode.

Additional non-limiting embodiments of the disclosure are set forth below:

Embodiment 1

A method of fabricating a photoactive device, comprising: forming GaInN on a substrate within a chamber; and substituting As atoms for some N atoms within the GaInN to transform at least a portion of the GaInN into GaInNAs.

Embodiment 2

The method of Embodiment 1, wherein substituting the As atoms for some of the N atoms within the GaInN comprises heating the GaInN in the chamber in the presence of an arsenic-containing gas or vapor.

Embodiment 3

The method of Embodiment 2, further comprising selecting the arsenic-containing gas or vapor to comprise $AsR_3$, wherein each R is individually selected from the group consisting of hydrogen, alkyl, aryl, and vinyl groups.

Embodiment 4

The method of Embodiment 3, further comprising selecting the arsenic-containing gas or vapor to comprise at least one of arsine and a metalorganic arsine precursor.

Embodiment 5

The method of Embodiment 4, further comprising selecting the arsenic-containing gas or vapor to comprise arsine.

Embodiment 6

The method of Embodiment 4, further comprising selecting the arsenic-containing gas or vapor to comprise tertiarybutylarsine.

Embodiment 7

The method of Embodiment 6, further comprising decomposing the tertiarybutylarsine in the chamber to form at least one of AsH and $AsH_3$.

Embodiment 8

The method of any one of Embodiments 2 through 7, wherein heating the GaInN in the chamber in the presence of the arsenic-containing gas or vapor further comprises heating the GaInN in the chamber in the presence of ammonia.

Embodiment 9

The method of any one of Embodiments 2 through 8, wherein heating the GaInN in the chamber in the presence of an arsenic-containing gas or vapor comprises heating the GaInN in the chamber to at least about 500° C.

Embodiment 10

The method of Embodiment 9, wherein heating the GaInN in the chamber to at least about 500° C. comprises heating the GaInN in the chamber to at least about 600° C.

Embodiment 11

The method of any one of Embodiments 1 through 10, wherein forming the GaInN on the substrate within the chamber comprises epitaxially growing the GaInN on the substrate within the chamber.

Embodiment 12

The method of Embodiment 11, wherein epitaxially growing the GaInN on the substrate within the chamber comprises employing a metalorganic chemical vapor deposition (MOCVD) or a hydride vapor phase epitaxy (HVPE) process to epitaxially grow the GaInN on the substrate within the chamber.

Embodiment 13

The method of Embodiment 12, further comprising selecting the substrate to comprise GaN, and wherein epitaxially growing the GaInN on the substrate within the chamber comprises epitaxially growing the GaInN directly on the GaN.

Embodiment 14

The method of any one of Embodiments 1 through 13, further comprising forming the GaInNAs to comprise $Ga_{1-y}In_yN_xAs_{1-x}$, wherein y is greater than 0.0 and less than 1.0, and x is between about 0.1 and about 0.5.

Embodiment 15

The method of any one of Embodiments 1 through 14, further comprising forming the GaInNAs to exhibit a bandgap energy of between about 0.9 eV and about 1.2 eV.

Embodiment 16

The method of any one of Embodiments 1 through 15, further comprising forming a multi-junction photovoltaic cell comprising the GaInNAs.

Embodiment 17

The method of any one of Embodiments 1 through 15, further comprising forming a light-emitting device comprising the GaInNAs.

Embodiment 18

The method of Embodiment 17, further comprising forming the light-emitting device to comprise a laser diode.

Embodiment 19

A method of fabricating a photoactive device, comprising: epitaxially growing a GaInN layer in a chamber; heating the GaInN layer in the chamber to at least 500° C.; introducing at least one gas or vapor comprising As atoms into the chamber; and converting at least a portion of the GaInN layer to into GaInNAs.

Embodiment 20

The method of Embodiment 19, wherein epitaxially growing the GaInN layer in the chamber comprises employing a metalorganic chemical vapor deposition (MOCVD) or a hydride vapor phase epitaxy (HVPE) process to grow the GaInN layer in the chamber.

Embodiment 21

The method of Embodiment 19 or Embodiment 20, wherein introducing at least one gas or vapor comprising As atoms into the chamber comprises introducing at least one of arsine and a metalorganic arsine precursor into the chamber.

Embodiment 22

The method of Embodiment 21, wherein introducing at least one of arsine and a metalorganic arsine precursor into the chamber comprises introducing tertiarybutylarsine into the chamber.

Embodiment 23

The method of any one of Embodiments 19 through 22, further comprising introducing ammonia into the chamber while introducing the at least one gas or vapor comprising As atoms into the chamber.

Embodiment 24

The method of any one of Embodiments 19 through 22, wherein heating the GaInN layer in the chamber to at least 500° C. comprises heating the GaInN layer in the chamber to at least 600° C.

Embodiment 25

The method of any one of Embodiments 19 through 24, wherein epitaxially growing the GaInN layer in the chamber comprises epitaxially growing the GaInN layer on a substrate comprising GaN in the chamber.

Embodiment 26

The method of any one of Embodiments 19 through 25, further comprising forming the GaInNAs layer to comprise $Ga_{1-y}In_yN_xAs_{1-x}$, wherein y is greater than 0.0 and less than 1.0, and x is between about 0.1 and about 0.5.

Embodiment 27

The method of any one of Embodiments 19 through 26, further comprising forming the GaInNAs layer to exhibit a bandgap energy of between about 0.9 eV and about 1.2 eV.

Embodiment 28

The method of any one of embodiments 19 through 27, further comprising forming a multi-junction photovoltaic cell comprising the GaInNAs layer.

Embodiment 29

The method of any one of Embodiments 19 through 27, further comprising forming a light-emitting device comprising the GaInNAs layer.

Embodiment 30

The method of Embodiment 29, further comprising forming the light-emitting device to comprise a laser diode.

Embodiment 31

A photoactive device fabricated by a method as recited in any one of Embodiments 1 through 30.

Embodiment 32

A photoactive device, the photoactive device fabricated by a method comprising: forming GaInN on a substrate within a chamber; and substituting As atoms for some N atoms within the GaInN to transform at least a portion of the GaInN into GaInNAs.

Embodiment 33

The photoactive device of Embodiment 32, wherein the photoactive device comprises a photovoltaic cell.

Embodiment 34

The photoactive device of Embodiment 32, wherein the photoactive device comprises a light-emitting device.

The embodiments of the invention described above do not limit the scope the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternative useful combinations of the elements described, will become apparent to those skilled in the art from the description. Such modifications are also intended to fall within the scope of the appended claims.

What is claimed is:

1. A method of fabricating a photoactive device, comprising:
    forming GaInN on a substrate within a chamber;
    after forming the GaInN on the substrate, heating the GaInN in the chamber in the presence of an arsenic-containing gas or vapor and substituting As atoms for some N atoms within the GaInN to transform at least a portion of the GaInN into a homogeneous layer of GaInNAs;
    repeating the actions of forming GaInN on the substrate within a chamber and heating the GaInN in the chamber in the presence of an arsenic-containing gas or vapor and substituting As atoms for some N atoms within the GaInN to transform at least a portion of the GaInN into homogeneous GaInNAs, so as to increase a thickness of the layer of the homogeneous GaInNAs; and
    forming a pn-junction in the layer of the homogeneous GaInNAs.

2. The method of claim 1, further comprising selecting the arsenic-containing gas or vapor to comprise $AsR_3$, wherein each R is individually selected from the group consisting of hydrogen, alkyl, aryl, and vinyl groups.

3. The method of claim 2, further comprising selecting the arsenic-containing gas or vapor to comprise at least one of arsine and a metalorganic arsine precursor.

4. The method of claim 3, further comprising selecting the arsenic-containing gas or vapor to comprise arsine.

5. The method of claim 3, further comprising selecting the arsenic-containing gas or vapor to comprise tertiarybutylarsine.

6. The method of claim 5, further comprising decomposing the tertiarybutylarsine in the chamber to form at least one of AsH and $AsH_3$.

7. The method of claim 6, wherein heating the GaInN in the chamber in the presence of the arsenic-containing gas or vapor further comprises heating the GaInN in the chamber in the presence of ammonia.

8. The method of claim 1, wherein heating the GaInN in the chamber in the presence of an arsenic-containing gas or vapor comprises heating the GaInN in the chamber to at least about 500° C.

9. The method of claim 8, wherein heating the GaInN in the chamber to at least about 500° C. comprises heating the GaInN in the chamber to at least about 600° C.

10. The method of claim 1, wherein forming the GaInN on the substrate within the chamber comprises epitaxially growing the GaInN on the substrate within the chamber.

11. The method of claim 10, wherein epitaxially growing the GaInN on the substrate within the chamber comprises employing a metalorganic chemical vapor deposition (MOCVD) or a hydride vapor phase epitaxy (HVPE) process to epitaxially grow the GaInN on the substrate within the chamber.

12. The method of claim 11, further comprising selecting the substrate to comprise GaN, and wherein epitaxially growing the GaInN on the substrate within the chamber comprises epitaxially growing the GaInN directly on the GaN.

13. The method of claim 1, wherein the GaInNAs comprises $Ga_{1-y}In_yN_xAs_{1-x}$, wherein y is greater than 0.0 and less than 1.0, and x is between about 0.1 and about 0.5.

14. The method of claim 1, wherein the GaInNAs exhibits a bandgap energy of between about 0.9 eV and about 1.2 eV.

15. The method of claim 1, further comprising forming a multijunction photovoltaic cell comprising the GaInNAs.

16. The method of claim 1, further comprising forming a light-emitting device comprising the GaInNAs.

17. The method of claim 16, further comprising forming the light-emitting device to comprise a laser diode.

18. A method of fabricating a photoactive device, comprising:
   epitaxially growing a GaInN layer in a chamber;
   heating the GaInN layer in the chamber to at least 500° C.;
   after epitaxially growing the GaInN layer in the chamber, introducing at least one gas or vapor comprising As atoms into the chamber;
   converting at least a portion of the GaInN layer into a homogeneous GaInNAs layer;
   repeating the actions of epitaxially growing a GaInN layer in a chamber, heating the GaInN layer in the chamber to at least 500° C. and converting at least a portion of the GaInN layer into a homogeneous GaInNAs layer so as to increase a thickness of the layer of the homogeneous GaInNAs; and
   forming a pn-junction in the layer of the homogeneous GaInNAs.

19. The method of claim 18, wherein epitaxially growing the GaInN layer in the chamber comprises employing a metalorganic chemical vapor deposition (MOCVD) or a hydride vapor phase epitaxy (HVPE) process to grow the GaInN layer in the chamber.

20. The method of claim 18, wherein introducing at least one gas or vapor comprising As atoms into the chamber comprises introducing at least one of arsine and a metalorganic arsine precursor into the chamber.

21. The method of claim 20, wherein introducing at least one of arsine and a metalorganic arsine precursor into the chamber comprises introducing tertiarybutylarsine into the chamber.

22. The method of claim 18, further comprising introducing ammonia into the chamber while introducing the at least one gas or vapor comprising As atoms into the chamber.

23. The method of claim 18, wherein heating the GaInN layer in the chamber to at least 500° C. comprises heating the GaInN layer in the chamber to at least 600° C.

24. The method of claim 18, wherein epitaxially growing the GaInN layer in the chamber comprises epitaxially growing the GaInN layer on a substrate comprising GaN in the chamber.

25. The method of claim 18, wherein the GaInNAs layer comprises $Ga_{1-y}In_yN_xAs_{1-x}$, wherein y is greater than 0.0 and less than 1.0, and x is between about 0.1 and about 0.5.

26. The method of claim 25, wherein the GaInNAs layer exhibits a bandgap energy of between about 0.9 eV and about 1.2 eV.

27. The method of claim 18, further comprising forming a multi-junction photovoltaic cell comprising the GaInNAs layer.

28. The method of claim 18, further comprising forming a light-emitting device comprising the GaInNAs layer.

29. The method of claim 28, further comprising forming the light-emitting device to comprise a laser diode.

* * * * *